(12) United States Patent
Sussman et al.

(10) Patent No.: US 7,239,136 B2
(45) Date of Patent: Jul. 3, 2007

(54) MOTION COMPENSATION FOR MAGNETIC RESONANCE IMAGING

(75) Inventors: Marshall S. Sussman, Toronto (CA); Naeem Merchant, Toronto (CA); Graham A. Wright, Toronto (CA); Lawrence M. White, Toronto (CA)

(73) Assignee: University Health Network, Toronto (CA)

( * ) Notice: Subject to any disclaimer, the term of this patent is extended or adjusted under 35 U.S.C. 154(b) by 38 days.

(21) Appl. No.: 11/115,308

(22) Filed: Apr. 27, 2005

(65) Prior Publication Data

US 2006/0244445 A1 Nov. 2, 2006

(51) Int. Cl.
*G01V 3/00* (2006.01)
(52) U.S. Cl. .................................... 324/307
(58) Field of Classification Search ............... None
See application file for complete search history.

(56) References Cited

U.S. PATENT DOCUMENTS

| | | | |
|---|---|---|---|
| 6,292,683 B1 | 9/2001 | Gupta et al. | |
| 6,509,735 B2 * | 1/2003 | Mueller et al. | 324/307 |
| 6,556,855 B2 * | 4/2003 | Thesen | 600/419 |
| 6,559,641 B2 * | 5/2003 | Thesen | 324/307 |
| 6,667,618 B2 * | 12/2003 | Thesen | 324/309 |
| 6,675,034 B2 | 1/2004 | Sussman et al. | |
| 6,704,593 B2 | 3/2004 | Stainsby et al. | |
| 6,771,998 B2 * | 8/2004 | Kirsch | 600/410 |
| 6,791,323 B2 * | 9/2004 | Wang et al. | 324/309 |

OTHER PUBLICATIONS

R.L. Ehman, J.P. Felmlee, Adaptive Technique for High-Definition MR Imaging of Moving Structures. Radiology 1989; 173: 255-263.
C.J. Hardy et al., Coronary Angiography by Real-Time MRI With Adaptive Averaging, Magnetic Resonance in Medicine, 44: 940-946 (2000).
R.W. Schaffer et al., Calculating a Reference from Navigators Placed over the Heart, Proc. Intl. Soc. Mag. Reson. Med. 10 (2002).
A.C. Larson et al., Self-Gated Projection Reconstruction Cardiac Cine Imaging, Proc. Intl. Soc. Mag. Reson. Med. 11 (2003) p. 379.

(Continued)

*Primary Examiner*—Diego Gutierrez
*Assistant Examiner*—Dixomara Vargas
(74) *Attorney, Agent, or Firm*—Bereskin & Parr

(57) ABSTRACT

An MRI system and method for acquiring motion-compensated MR image data of an object. The MRI system includes an MRI device for generating a uniform magnetic field through the object, magnetic field gradients for imaging a portion of the object and an RF excitation field for evoking NMR response signals from the object; a computer for controlling the operation of the MRI system; a motion compensation module for generating a plurality of navigator waveforms for evoking a corresponding plurality of navigator echoes from the portion of the object while the object is being imaged, and processing the plurality of navigator echoes by determining a subset of similar navigator echoes and removing rigid-body translation from the NMR response signals associated with the subset of similar navigator echoes; and, interface circuitry for generating the magnetic gradient, RF and navigator waveforms and sampling the NMR response signals and the plurality of navigator echoes.

28 Claims, 4 Drawing Sheets

OTHER PUBLICATIONS

T. A. Spraggins, Wireless Retrospective Gating: Application to Cine Cardiac Imaging. Magnetic Resonance Imaging 1990; 8: 675-681.

M. S. Sussman, J. A. Stainsby, N. Robert, N. Merchant, G. A. Wright, Variable-Density Adaptive Imaging for High-Resolution Coronary Artery MRI. Magnetic Resonance in Medicine 2002; 48; 753-764.

Y. Wang, R. C. Grimm, J. P. Felmlee, S. J. Riederer, R. L. Ehman, Algorithms for Extracting Motion Information from Navigator Echoes. Magnetic Resonance in Medicine 1996; 36: 117-123.

Y. Wang, R. L. Ehman, Retrospective Adaptive Motion Correction for Navigator-Gated 3D Coronary MR Angiography. Journal of Magnetic Resonance Imaging 2000; 11: 208-214.

* cited by examiner

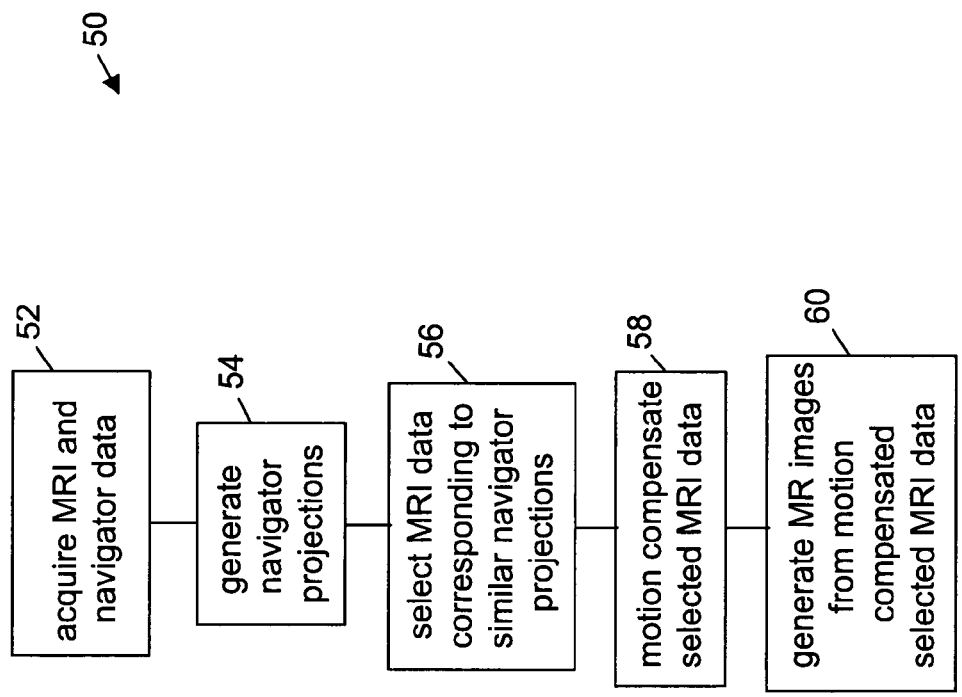

MOTION COMPENSATION FOR MAGNETIC RESONANCE IMAGING

FIELD OF THE INVENTION

The invention relates to a magnetic resonance imaging (MRI) system. More particularly, the invention relates to motion compensation for an MRI system.

BACKGROUND OF THE INVENTION

MRI systems are commonly used to obtain an interior image from a patient for a particular region of interest that can be used to determine the health of the patient. MRI systems include a main magnet assembly for providing a strong uniform main magnetic field to align the individual magnetic moments of the $^1H$ atoms within the patient's body. If the tissue is subjected to an additional electromagnetic field, which is tuned to the Larmor frequency, the $^1H$ atoms absorb additional energy which rotates the net aligned moment of the $^1H$ atoms. The additional magnetic field is typically provided by an RF excitation signal. During this process, the $^1H$ atoms oscillate around their magnetic poles at their characteristic Larmor frequency, thereby emitting an NMR signal. When the additional magnetic field is removed, the magnetic moments of the $^1H$ atoms rotate back into alignment with the main magnetic field. The NMR signal is received and processed to form an MRI scan or image. The MRI scan is most commonly based on the distribution of $^1H$ atoms within the body. Bodily fluids have the highest density of $^1H$ atoms, followed by soft tissues, then cartilage and then membranes.

If the main magnetic field is uniform across the entire body of the patient, then the RF excitation signal will excite all of the $^1H$ atoms in the patient non-selectively. Accordingly, in order to image a particular portion of the patient's body, magnetic field gradients Gx, Gy and Gz in the x, y and z directions, having a particular timing, frequency and phase, are superimposed onto the uniform magnetic field such that the RF excitation signal excites the $^1H$ atoms along a desired slice of the patient's body and unique phase and frequency information is encoded in the NMR signal depending on the location of the $^1H$ atoms along the "image slice". Gradient amplifiers are switched on to provide the magnetic field gradients Gx, Gy and Gz. The frequencies in the NMR signal come from different locations in the selected slice, while the signal strength reveals the density of the $^1H$ atoms. The frequencies in the NMR signal also depend on the strength of the local magnetic field produced by the combination of the uniform magnetic field and the magnetic field gradients at the selected slice.

Typically, portions of the patient's body to be imaged are scanned by a sequence of measurement cycles in which the magnetic field gradients Gx, Gy and Gz vary according to the particular MRI imaging protocol that is being used. For each MRI scan, the resulting NMR signals are digitized and processed to reconstruct the image in accordance with the MRI imaging protocol that is used, many of which are well known to those skilled in the art.

The data acquired from the NMR signal is referred to as k-space data which is a two-dimensional data set in the case of 2D imaging. The k-space data provides frequency and phase information from which an MR image is produced via application of the inverse 2D Fourier Transform, for example. The manner in which the NMR signal is generated and sampled to provide the 2D k-space data is referred to as a k-space trajectory. Different k-space trajectories confer different properties on the reconstructed MR image.

Data acquisition for MR imaging can require a time period of several seconds to several minutes. During this time period, significant anatomical motion may occur. This is particularly true when performing cardiac, abdominal, joint, and interventional imaging. Without corrective action, this motion will produce artifacts that may degrade image quality.

To minimize motion-related artifacts, some techniques have been developed that synchronize the MR scan to the anatomical motion. To accomplish this synchronization, some measure of anatomical motion is obtained. Existing techniques attempt to infer motion through analyzing a variety of physiological parameters such as ECG waveforms (for cardiac-related motion) or diaphragm position (for respiratory-related motion). However, the drawback with these measures is that they may be unreliable in certain patient populations. For example, in patients with ischemic heart disease, arrhythmias may result in erratic ECG activity. Furthermore, some types of motion (e.g. joint motion) may not be easily related to any physiological parameter.

Other techniques that have been developed to minimize motion-related artifacts include the use of navigator echoes [1] in which two different types of MR data are acquired. The first data type is used to form the MR image. The second data type is used to assess and compensate for the anatomical motion that occurs over the course of MRI data acquisition. The second data type is typically acquired at regular intervals throughout MRI data acquisition, interleaved with the type 1 data acquisition. Data of the second data type is referred to as "navigator echoes". Navigator echoes generally differ in two respects: the nature of the navigator echo, and the manner in which the navigator echo data is processed.

Most navigator echoes consist of data acquisition of a single line in k-space. This data is processed to provide a 1D projection of the anatomy. In some cases, additional localization in the remaining two spatial dimensions may be provided by the application of spatially selective radiofrequency (RF) pulses. Depending on the type of motion one is interested in correcting for, the navigator echo data may be acquired at a location remote from the anatomy of interest. For example, in cardiac imaging, navigator-echo data is typically acquired from the diaphragm to provide information about respiratory motion.

The 1D projections of the anatomy derived from the navigator echo data are processed to provide information on the nature of the anatomical motion. In many cases, this is accomplished by calculating the displacement between the 1D projections [2]. The displacement information is used to select the type 1 data that will provide an image with minimal motion artifacts. In most cases, type 1 data is selected based on the associated navigator echo possessing a minimal displacement.

However, there are some drawbacks with conventional navigator-based motion compensation techniques. First, because data is selected based on a minimum (i.e. not necessarily zero) displacement criterion, some residual motion may remain within the data. Under these circumstances, motion artifacts will be reduced, but not eliminated. In theory, the effects of motion could be eliminated completely by removing the navigator-echo-determined displacement from the type 1 data prior to image reconstruction. In practice, reduction in motion artifacts provided by this latter approach is limited [3] because the rigid-body motion calculated from the navigator echoes generally does not accurately describe the more complex (i.e. non-rigid-body) anatomical motion. This problem is exacerbated if the navigator is placed at a location remote from the anatomy of interest, such as in cardiac imaging where diaphragmatic navigators are used.

SUMMARY OF THE INVENTION

In one aspect, at least one embodiment of the invention provides an MRI system for acquiring MR image data for an object and performing motion compensation on the MR image data. The MRI system include an MRI device for generating a uniform magnetic field through the object, magnetic field gradients for imaging a portion of the object and an RF excitation field for evoking NMR response signals from the object; a computer for controlling the operation of the MRI system; a motion compensation module for generating a plurality of navigator waveforms for evoking a corresponding plurality of navigator echoes from the portion of the object while the object is being imaged, and processing the plurality of navigator echoes by determining a subset of similar navigator echoes and removing rigid-body translation from the NMR response signals associated with the subset of similar navigator echoes; and, interface circuitry for generating waveforms in response to instructions received from the computer and the motion compensation module and sending the waveforms to the MRI device for producing the magnetic field gradients, the RF excitation field and the navigator waveforms, the interface circuitry further being configured for sampling the NMR response signals and the plurality of navigator echoes.

In another aspect, at least one embodiment of the invention provides a method for acquiring MR image data for an object and performing motion compensation on the MR image data. The method comprises:

(a) generating a uniform magnetic field through the object;

(b) generating magnetic field gradients for imaging a portion of the object and an RF excitation field for evoking NMR response signals from the object;

(c) generating a plurality of navigator waveforms for evoking a corresponding plurality of navigator echoes from the portion of the object while the object is being imaged;

(d) sampling the NMR response signals and the plurality of navigator echoes; and, (e) processing the plurality of navigator echoes by determining a subset of similar navigator echoes according to a similarity metric and removing rigid-body translation from the sampled NMR response signals associated with the subset of similar navigator echoes.

BRIEF DESCRIPTION OF THE DRAWINGS

For a better understanding of the invention and to show more clearly how it may be carried into effect, reference will now be made, by way of example only, to the accompanying drawings which show at least one exemplary embodiment of the invention and in which:

FIG. 2 is a flowchart of an exemplary embodiment of a motion compensation method used by the MRI system to compensate for motion during data acquisition;

DETAILED DESCRIPTION OF THE INVENTION

Figure 1:
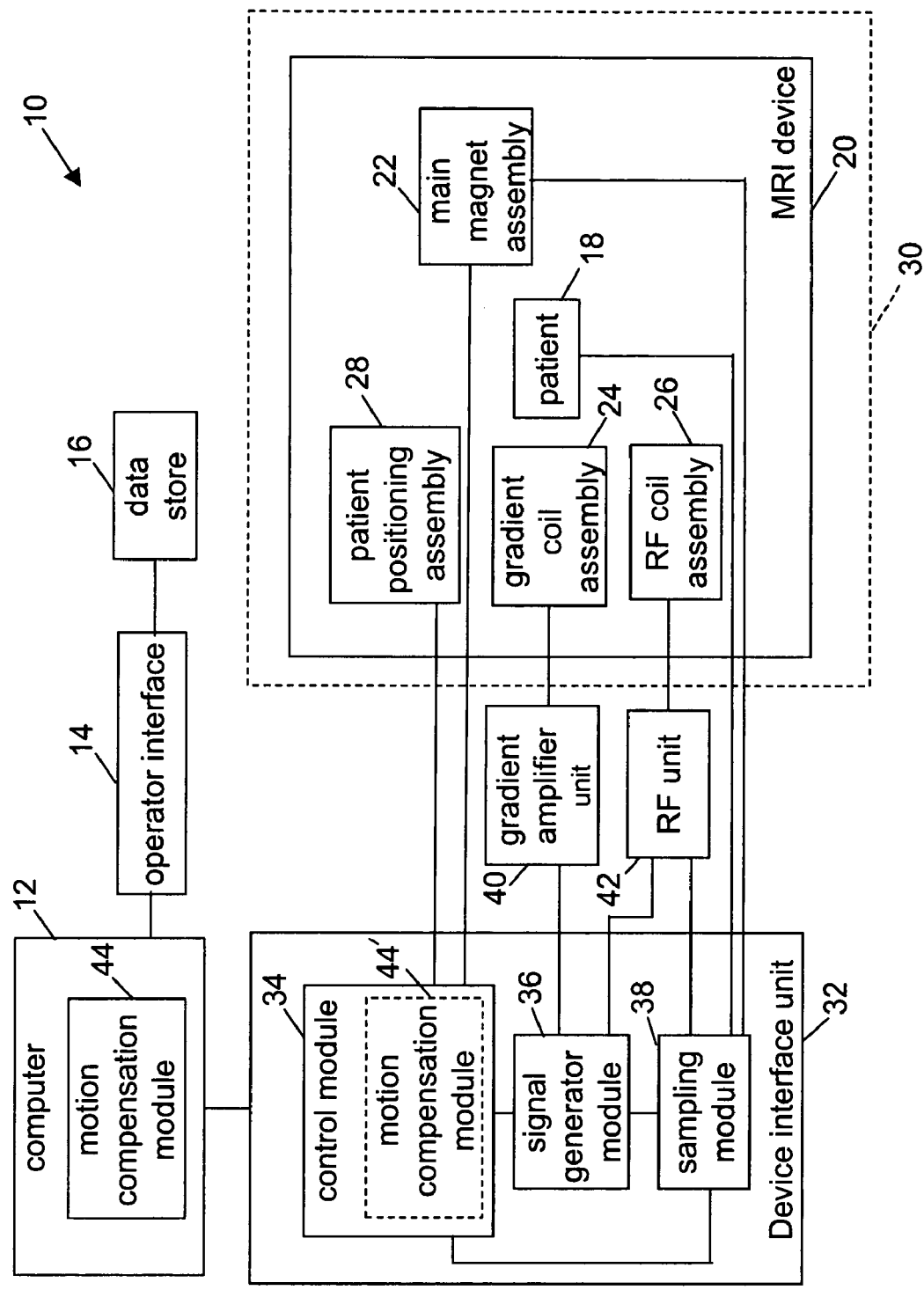
FIG. 1 is a block diagram of an exemplary embodiment of an MRI system in accordance with the invention.

It will be appreciated that numerous specific details are set forth in order to provide a thorough understanding of the invention. However, it will be understood by those of ordinary skill in the art that the invention may be practiced without these specific details. In other instances, well-known methods, procedures and components have not been described in detail so as not to obscure the invention. Further, where considered appropriate, reference numerals may be repeated among the figures to indicate corresponding or analogous elements.

Referring now to FIG. 1, shown therein is a block diagram of an exemplary embodiment of an MRI system 10 in accordance with the invention. The MRI system 10 includes a computer 12, an operator interface 14 and a data store 16. The MRI system 10 further includes several power supplies (not shown) connected to various components of the MRI system 10 as is commonly known to those skilled in the art.

An operator interacts with the computer 12 via the operator interface 14 to control the activity of the MRI system 10. The operator interface 14 may include a keyboard, a display, a mouse, a trackball and other suitable user input/output devices. The operator can use the operator interface 14 to input data related to a patient 18 that is being imaged such as patient identification information and test information including the nature of the MRI scan that must be performed. The operator can also use the operator interface 14 to input information related to system parameters that are needed for proper operation of the MRI system 10 such as calibration information and system operating parameters including scan type, scan length, magnetic field strength, type of sampling that is used, and the like. Data that is obtained from tests, as well as parameters used for system operation, may be stored in the data store 16. The data store 16 may be a separate hard drive or some other suitable data storage device. The stored data may include raw sampled data as well as processed MR image data.

The MRI system 10 further includes an MRI device 20 that provides components for generating magnetic fields to magnetize and scan the patient 18 and for positioning the patient 18 depending on the portion of the patient 18 that is to be imaged. The MRI device 20 includes a main magnet assembly 22, a gradient coil assembly 24, an RF coil assembly 26 and a patient positioning system 28. To reduce interference from external sources, the MRI device 20 is placed within an RF-shielded enclosure 30.

The main magnet assembly 22 may be a resistive magnet, or a superconductive magnet which both require a power supply (not shown) for operation. Alternatively, the main magnet assembly 22 may include a permanent magnet. The main magnet assembly 22 includes a bore that the patient 18 is placed within. A shim power supply (not shown) may also be used to energize shim coils (not shown) that are used with the main magnet assembly 22 to correct any non-uniformity in the main magnetic field that is generated by the main magnet assembly 22.

Typically, the gradient coil assembly 24 and the RF coil assembly 26 are also placed within the bore of the main magnet assembly 22 and are circumferentially located with respect to the patient 18. It is understood by those skilled in the art that the magnet 22, and coils 24 and 26 can be situated in a variety of configurations around the patient 18.

The gradient coil assembly 24 is energized to generate magnetic field gradients Gx, Gy and Gz that are superimposed on the main magnetic field produced by the main magnet assembly 22.

The RF coil assembly 26 may include one set of coils for transmitting and receiving RF energy or separate transmit and receive coils for separately transmitting and receiving RF energy. The RF coil assembly 26 generates the RF excitation pulses which, in combination with the magnetic field gradients Gx, Gy and Gz, encode spatial information into the NMR signals generated by the region of the patient 18 being imaged. The NMR signals are also sensed by the RF coil assembly 26.

The patient positioning system 28 includes a patient cradle and a transport unit (both not shown) and interfaces with an alignment system (not shown) associated with the main magnet assembly 22. The patient 18 lies on the patient cradle and is positioned by the transport unit within the bore of the main magnet assembly 22. The transport unit may position the patient 18 at certain locations within the bore of the main magnet assembly 22 in conjunction with the alignment system according to the MRI scan protocol.

The MRI system 10 further comprises a device interface unit 32 that includes a control module 34, a signal generator module 36, and a sampling module 38. The MRI system 10 further includes a gradient amplifier unit 40 and an RF unit 42. The device interface unit 32, the gradient amplifier unit 40 and the RF unit 42 may be referred to as interface circuitry that interfaces the computer 12 to the MRI device 20.

The control module 34 receives instructions from the computer 12 to follow a particular MRI scan protocol for imaging the patient 18. The control module 34 instructs the patient positioning system 28 to move the patient 18 into the proper position within the bore of the main magnet assembly 22 according to the MRI scan protocol. Depending on the type of magnet used in the main magnet assembly 22, the control unit 34 may also be connected to the main magnet assembly 22 to control various parameters of the main magnetic field that is generated by the main magnet assembly 22. The control module 34 also instructs the signal generator module 36 to generate a particular gradient waveform sequence and pulse sequence that will be applied to the gradient coil assembly 24 and the RF coil assembly 26 by the gradient amplifier unit 40 and the RF unit 42 respectively. The control module 34 may also provide timing information to the sampling module 38, including the length of data acquisition and the type of k-space data acquisition that is used, for sampling data from the RF coil assembly 26. The control module 34 may also provide timing information for sampling data from the patient 18 and the main magnet assembly 22.

The signal generator module 36 produces the proper gradient waveforms Gx, Gy and Gz and RF waveforms needed for a variety of MRI scan protocols including spin echo, fast spin echo, and the like. The signal generator module 36 receives control signals from the control unit 34 to set the shape and timing of the magnetic field gradients that are generated by the gradient coil assembly 24. Based on these control signals, the signal generator module 36 also generates RF waveforms for setting the amplitude, shape and timing of the RF pulses that are produced by the RF coil assembly 26. Both of the sets of gradient and RF waveforms may be created digitally and the signal generator module 36 may further include a digital to analog converter (DAC) (not shown) that converts the digital waveforms to corresponding analog waveforms. The signal generator module 36 may further include a switching device that connects the output of the DAC to either the gradient amplifier unit 40 or the RF unit 42. Alternatively, separate DACs may be used to send the gradient pulse waveforms and the RF waveforms to the gradient amplifier unit 40 and the RF unit 42 respectively. The signal generator 36 may also generate timing signals that are sent to the sampling module 38 so that the NMR signals are correctly sampled depending on the type of gradient and RF waveforms that are sent to the gradient coil assembly 24 and the RF coil assembly 26 respectively.

The gradient amplifier unit 40 typically includes three amplifiers, i.e. one amplifier for each of the gradient pulse waveforms Gx, Gy and Gz. The gradient amplifier unit 40 receives the analog version of the gradient pulse waveforms, amplifies these waveforms and applies them to the corresponding coils in the gradient coil assembly 24.

The RF unit 42 includes a transceiver, a transmit amplifier, a receive amplifier and an analog to digital converter (ADC) (all not shown). The transceiver receives the RF waveforms from the signal generator module 36, and modulates these waveforms to generate RF excitation pulses. The transmit amplifier receives and amplifies the RF excitation pulses and provides the amplified RF excitation pulses to the RF coil assembly 26 which radiates these pulses to the patient 18. After excitation, the NMR signals generated by the patient 18 are sensed by the RF coil assembly 26. The receive amplifier then receives the sensed NMR signals from the RF coil assembly 26, amplifies the sensed NMR signals and provides the amplified NMR signals to the transceiver. The transceiver then pre-processes the amplified NMR signals by applying demodulation and filtering. The pre-processed NMR signals are then sent to the sampling module 38 for sampling.

The sampling module 38 receives and samples the pre-processed NMR signals to produce raw k-space data. The k-space data provides information about the MRI scan in the spatial frequency domain. The sampled k-space data contains spatial data for each imaging "slice" that is measured and in the most common implementation can be arranged into a series of two-dimensional (2D) arrays. Each k-space data entry provides frequency and phase information with the frequency information increasing along the x-axis of a given 2D k-space data array and the phase information increasing along the y dimension of the given 2D k-space data array. The centre of the 2D k-space data array represents DC and the edges of the 2D k-space data array correspond to high spatial frequencies.

The raw k-space data is sent to the control module 34 where it may be further processed and/or sent to the computer 12 for processing and storing on the data store 16. In both cases, processing produces MR image data from the raw k-space data. The MR image data may be displayed on the display of the operator interface 14. The MR image data may also be further image processed by either the control module 34 or the computer 12. Processing typically includes application of the inverse 2D Fourier Transform to generate image data from a 2D k-space data set. Accordingly, the control module 34 may further include dedicated processing circuitry such as an array processor, as is well known to those skilled in the art, that inverse Fourier transforms the raw k-space data. The array processor is used to speed up numeric computation. Other types of image processing algorithms may also be applied to the MR image to improve the quality of the MR images.

The sampling module 38 may also be connected to various sensors attached to the patient for collecting information about the patient 18 including EEG, ECG and EMG data. The sampling module 38 may also be connected to the main magnet assembly 22 to record data about the main magnetization field.

In accordance with the invention, the MRI system 10 further includes a motion compensation module 44 for performing a motion compensation method 50. The motion compensation module 44 may be implemented in computer program code containing instructions embodied in tangible computer media (i.e. CD-ROM, etc.) or any other computer-readable storage medium, wherein the computer program code is loaded into and executed by the computer 12. Alternatively, the motion compensation module 44 may be located within the device interface unit 32 and executed by the control module 34. In a further alternative, the motion compensation module 44 may be implemented by dedicated signal processing circuitry located in the device interface unit 32. An alternative location of the motion compensation module is indicated with dashed lines and reference numeral 44'.

Figure 3A:
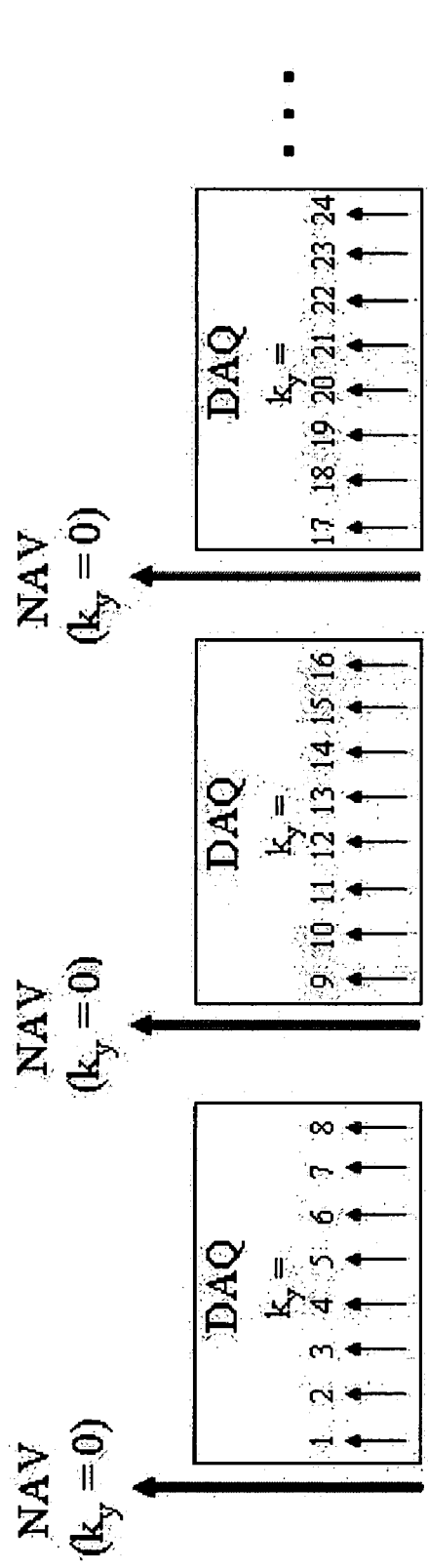
FIG. 3a is an exemplary timing diagram that may be used for obtaining MRI data according to the motion compensation method of FIG. 2 with the ky=0 lines indicating the acquisition of navigator echoes.

The motion compensation module 44 provides timing signals and control parameters to the signal generator and sampling modules 36 and 38 for generating navigator waveforms and sampling the resulting navigator echo data. The navigator waveforms are generated such that the waveforms are interspersed within the sequence of magnetic gradient and RF waveforms that are typically generated to collect MRI data. The navigator waveforms include particular magnetic gradient waveforms for selecting a portion of the patient 18 to be imaged and a suitable RF excitation pulse to collect navigator echo data as is well known to those skilled in the art. An example of one timing sequence is shown in FIG. 3a. The motion compensation method 50 may be applied to almost any type of MR imaging sequence such as 3D FIESTA, spiral, EPI, PR, etc. In the experimental data discussed further below, the motion compensation method 50 is used in conjunction with a 2D FIESTA MRI sequence.

Acquisition time for a navigator echo is relatively short, i.e. less than 10 ms, because the navigator waveforms only sample a small fraction of k-space to determine motion information. In general, one may detect motion that has occurred between acquisition of the navigator echoes by comparing the magnitude and phase information of the navigator echoes. The timing of the navigator waveforms is selected based on the timing of motion that is expected when imaging a particular portion of the patient 18. The timing between navigator waveforms is selected such that there is not too much motion in between consecutive waveforms. For example, when imaging the heart, one may require navigator echoes spread less than 30 ms apart to visualize the systolic phase of the cardiac cycle. To image much slower motion in the abdomen, one may only need to acquire navigator echoes every second in order to resolve the respiratory-induced motion. The timing between consecutive navigator waveforms also affects the resolution of movie loops that may be obtained based on the MR images. This is discussed in further detail below.

The motion compensation module 44 generates the navigator waveforms and corresponding RF waveforms for acquiring navigator echo data directly from the anatomy of interest that is being imaged. This is in contrast to conventional navigator-based motion compensation methods which obtain navigator data at locations remote from the anatomy of interest, or in conjunction with additional spatial localization achieved through the application of RF pulses. This enables the motion compensation method 50 to account for motion that is local to the region of interest as well as for motion that is due to the activity of body parts that are not part of the region of interest, such as the lungs of the patient 18 for example, but nevertheless affect the region of interest. This also results in an increase in data sampling efficiency since "extra data" does not need to be acquired to compensate for motion in the region of interest.

In MR imaging, there are two types of motion that cause artifacts: rigid-body motion and non-rigid body motion. Rigid-body motion refers to motion that consists of a pure translation plus a rotation. Non-rigid-body motion consists of motion due to the deformation of the object being imaged such as the heart. In conventional MR motion compensation techniques, it is typically assumed that the motion under consideration can be reasonably described as rigid-body. In general, if the object being imaged undergoes a rigid-body translation during MRI data acquisition, the result is that a linear phase shift, related to the amount of rigid-body translation, is applied to the corresponding k-space data. To remove the rigid-body translation, the opposite linear phase shift may be applied to the k-space data.

Further, unlike conventional methods, the motion compensation module 44 uses the navigator echo data to select MRI data that differs by rigid-body translations as well as a certain amount of noise that is typically encountered. This is accomplished by selecting data based on the relative similarity, rather than the relative displacement, between a reference navigator echo and subsequent navigator echoes. Thus, even if the overall anatomical motion includes non-rigid-body or non-translational motion, the MR image formed from the subset of selected data can in theory be completely motion corrected by applying an appropriate linear k-space phase factor to the selected MRI data. This can be achieved by using a similarity metric that is robust to rigid-body translations which means that if two navigator echoes differ only by a rigid body translation, as well as noise that is typically encountered in MR image data, then the similarity metric will identify the two navigator echoes as being similar to one another. The result is that the relative non-rigid body motion between the MR data associated with these two navigator echoes will be minimal. There will therefore not be any artifacts in the reconstructed MR image due to non-rigid body or non-translational motion. Further, if a rigid-body translation has occurred between these two MR data sets, which can be identified by examining the associated navigator echo data, then a linear k-space phase factor can be calculated and applied to one of the datasets to correct for the rigid-body translation.

Referring now to FIG. 2, shown therein is an exemplary embodiment of the motion compensation method 50 used by the MRI system 10 to compensate for motion during data acquisition in accordance with the invention. The first step 52 of the method 50 is to acquire MRI and navigator echo data. To acquire this data, navigator waveforms are at least quasi-periodically interspersed within the magnetic gradient and RF pulse waveforms that are applied to the gradient amplifier unit 40 and the RF unit 42 respectively. It should be understood that a quasi-periodic sequence also includes a periodic sequence. In one embodiment, the navigator waveforms may be generated to acquire a central k-space line [4] in which at least one of the k-space variables is 0. For instance, the Gz gradient waveform may be used to select a location along the z axis of the patient 18 for imaging while the Gx and Gy gradient waveforms may be generated such that the y-variable is 0 and the k-space trajectory follows the x-axis. This provides navigator data that, when Fourier Transformed, provides a projection image along the x-axis to show horizontal movement. Alternatively, the Gx and Gy gradient waveforms may be generated such that the x-variable is 0 and the k-space trajectory follows the y-axis. This provides navigator data that, when Fourier Transformed, provides a projection image along the y-axis to show vertical movement. In a further alternative, this approach may be extended to multiple dimensions by acquiring a single line though k-space along more an arbitrary direction (e.g. at some angle in the xyz coordinate system) to compensate for motion in that direction. In a further alternative embodiment, navigators may be acquired from multiple gradient axes to increase sensitivity from more than one spatial dimension in a given navigator period. This may be done by generating navigator waveforms for obtaining a reference projection along one axis, such as the x axis, and then generating navigator waveforms for obtaining a reference projection along another axis, such as the y axis, and computing a multidimensional similarity metric to find navigator echoes that are similar in both dimensions.

An example of a timing diagram is shown in FIG. 3a in which the navigator waveforms (indicated by NAV) are obtained for a line through the center of k-space along ky=0. The MRI data acquisition, represented by DAQ, corresponds to a 2D-FIESTA MR imaging sequence. The location of the navigator waveforms may be interspersed with various periodicities within the MRI data acquisition sequence to provide a desired amount of temporal resolution for motion compensation. Accordingly, there is a tradeoff between the periodicity of the navigator waveforms, the ratio of time spent on the acquisition of navigator and image data respectively, and computational intensity.

In conventional navigator-based motion compensation methods, the type of navigator waveforms that were used depended on the portion of the patient 18 that was imaged. For instance, when imaging the brain, conventional techniques included applying the navigator waveforms directly to the brain of the patient 18 being imaged. However, in cases of non-rigid body translational motion such as the heart, other forms of navigator waveforms were used such as images of the diaphragm. In contrast, the navigator waveforms and data processing of the motion compensation method 50 can be similarly applied regardless of the type of anatomy being imaged and the motion that may be present.

Figure 3B:
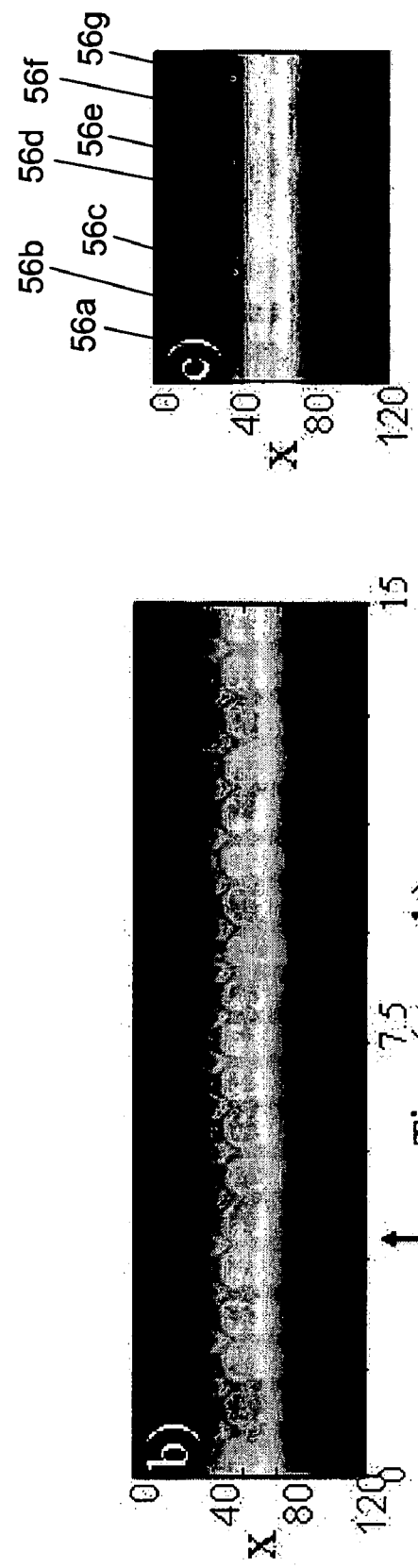
FIG. 3b is a diagram of 1D projections of navigator echoes as a function of time for real MRI data obtained from the heart.

In step 54, a set of projections ($P_i(x)$; i=1, . . . , n) of the region of interest of the patient 18 being imaged is generated. An example of a set of projections obtained from real navigator echo data is shown in FIG. 3b. The navigator echo data was obtained from a subject's heart with a ky=0 k-space sampling trajectory as a function of time. The x direction is superior-inferior and the projection direction is medial-lateral. There is a cyclical behavior in the projection data due to cardiac and respiratory motion. Since, in this example, the navigator data was obtained by sampling with a k-space trajectory in which ky=0, when the inverse Fourier transform is applied to the sampled data, the projection along the x axis is obtained.

In step 56, MRI data corresponding to the navigator projections that are similar to one another are selected. This may be implemented by arbitrarily selecting a given navigator projection as a reference projection ($P_{ref}(x)$). A similarity metric is then used to find the navigator projections that are most similar to one another. As part of this process, rigid-body translation between the projections are also calculated. These two operations may be combined by calculating the rigid-body translation between the reference projection $P_{ref}$ and each of the navigator projections $P_i$ to find the location $\Delta x_i$ that maximizes a given similarity metric (C) generally represented as shown in equation 1.

$$C_i(x) = \|P_{ref}(x), P_i(x+\Delta x)\| i=1, \ldots, n \quad (1)$$

Many different similarity metrics can be used such as the correlation coefficient, least squares, cross-correlation, mutual information and the like. Some of these similarity metrics are more preferable than others. For instance, the correlation coefficient and mutual information similarity metrics are more robust and insensitive to biases and gains in the navigator projections. Mutual information is further robust and insensitive to variations in contrast of different tissue types between the reference and navigator projections. Each of these metrics are known to those skilled in the art. For the particular exemplary implementation discussed below, a correlation coefficient similarity metric is used [5].

In conventional navigator-based motion compensation techniques, MRI data associated with a particular navigator projection $P_i$ is used if the calculated $\Delta x_i$ is sufficiently small. However, if non-rigid-body motion is present, $\Delta x_i$ may not accurately describe the true displacement. In contrast with conventional techniques, the motion compensation method 50 selects data associated with a given navigator projection $P_i$ only if the similarity metric, $C_i(\Delta x_i)$, is sufficiently large. Sufficiently large means that the similarity metric value calculated for a reference navigator projection and another given navigator projection, that are similar to one another, is that which would be expected for two projections that differ by noise and possibly a rigid-body translation. The magnitude of the noise in an MR image depends on a number of factors related to the MR system itself, the object being imaged, and the specific pulse sequence used to acquire the image. Displacement itself plays no role in data selection in the sense that the motion compensation method 50 does not select data based on the relative displacement between the navigators. Ideally, the motion compensation method 50 identifies a set of navigator projections $P_i$'s that are substantially similar except for rigid-body translations plus noise. These displacements can be corrected completely in step 58 by applying an appropriate linear k-space phase factors (i.e. $e^{-i2\pi kx\Delta xi}$) to the MRI data corresponding to the selected navigator projections so that the motion relative to the reference projection is removed. Accordingly, the motion compensation method 50 selects MRI data based on a set of navigators that has been identified in which the navigator echo data is substantially similar to one another within the limits of noise plus a possible rigid-body translation.

Figure 3C:
FIG. 3c is a subset of the 1D projections of FIG. 3b in which the 1D projections were selected based on maximal similarity to a reference projection.

FIG. 3c shows a subset of navigator projections with maximal similarity selected from the set of navigator projections shown in FIG. 3b. The reference projection was selected arbitrarily at time=4.4 s (shown by the arrow in FIG. 3b). There is some displacement ($\Delta x_i$) between some of the projections in the subset some of which are indicated with reference labels 56a, . . . , 56g. These displacements are calculated depending on the similarity measure that is used. For instance, if the correlation coefficient is used as a similarity metric then the displacement can be determined based on the difference between the location of the maximum correlation value between a given navigator projection and the reference navigator projection and the location of the maximum in the autocorrelation coefficient of the reference navigator projection. These displacements are removed from the MRI data associated with each selected navigator projections in step 58 by applying the appropriate linear k-space phase factor. MR images are then generated from the motion compensated MRI data in step 60 as is well known to those skilled in the art.

To form an MR image at any time during MRI data acquisition, the navigator echo data acquired at that time may be taken as a reference. In this manner, temporal resolutions of up to twice the data acquisition period may be achieved (i.e. if navigators are used in every second data acquisition period, the intervening period being occupied by the image data acquisition). Accordingly, with the motion compensation method 50, any navigator waveform can be used to motion compensate an MR image at any point during the data acquisition. This also allows for the generation of movie loops with a temporal resolution as fine as the time between navigator waveforms. The movie loop enables dynamic information to be obtained for the region of interest. Using FIG. 3a as an example, a movie loop may be generated by selecting the projections obtained from the first and second navigator echoes as two separate navigator reference projections. For each navigator reference projection, MRI data is then selected based on maximal similarity. Some portions of the MRI data may be selected for both of the navigator reference projections but in general the MRI data sets selected based on both of the navigator reference projections will be different from one another and hence the reconstructed MR images will be slightly different from one another which provides temporal information when the reconstructed MR images are displayed one after another in a movie loop fashion. Note that, by varying the frequency of the navigator waveforms, the temporal resolution of the navigators can be traded off against efficiency since there will be more sampled k-space data associated with each navigator.

The motion compensation method 50 may be used with virtually any pulse sequence (e.g. 3D scans, spiral, echo-planar (EPI), PR, etc.). In these cases, the waveforms in the DAQ windows indicated in FIG. 3a are the desired data acquisition sequence, rather than a linear k-space trajectory as is currently shown. All that is required is a sufficient sampling of navigator echo data. Accordingly, the motion compensation method 50 can be easily incorporated into a broad range of pulse sequences.

Data acquisition may cease when the similarity metrics of the set of selected navigator echoes reach a sufficient value. This may mean that a sufficient number of selected navigator projections are obtained that differ only by noise plus a possible rigid-body translation. This may be determined by analyzing the expected value of the similarity metric under the condition that the navigator projections are substantially similar except for noise. For example, in the case of the correlation coefficient similarity metric, the sufficiency criterion is satisfied if the standard deviation of the correlation coefficient values under a Fisher Transformation [1] is less than the inverse of the square root of the number of pixels in the reference projection.

Alternatively, other termination criteria may be used. For example, data acquisition can be terminated when a steady state of navigator projections is achieved (i.e. when no further change, within the limits of noise, in the correlation values is observed after a specified period of time). In another example, only a time criterion may be used, i.e. sample the MRI data until a specified amount of time has elapsed, such as two minutes for example. The alternative termination criteria may or may not be sufficient for selecting navigator echo data that differ only by rigid-body translation plus noise. However, the alternative termination criteria may be more optimal in terms of other parameters such as efficiency.

Referring once again to FIG. 3a, in one embodiment, all of the k-space data may be repeatedly sampled until the sufficiency criterion is met. For example, assuming the linear k-space sampling trajectory shown in FIG. 3a, and assuming that 128 lines in k-space are acquired, then there are 16 corresponding navigator echoes. Assuming that the projection for the first navigator echo is used as a reference and that the projection for the second navigator echo satisfies the similarity criterion on the first pass of sampling all 128 lines in k-space while at least one of the projections for the other navigator echoes do not, then the k-space data associated with all navigator projections may be repeatedly sampled until the sufficiency criterion is met. In this case, even though the data associated with the first and second navigator projections is reacquired, it will not be retained for the final data set since it has already met the sufficiency criterion. In an alternative embodiment, the k-space sampling trajectory may be modified such that on a subsequent sampling of the k-space data, only those portions of k-space data are sampled for which the corresponding navigator projection have not yet met the sufficiency criterion. With respect to the earlier example, this means that the k-space data (i.e. ky=1 to 16) associated with the first two navigators are not sampled again. This is a more efficient method of data acquisition that is done in real-time.

It should also be noted that if more than one navigator projection is obtained for a given portion of k-space data, then a multi-dimensional version of the similarity metric may be used. For instance, navigator projections may be obtained along the x (ky=0) and y (kx=0) axes. In this case, taking FIG. 3a as an example, after each navigator waveform for ky=0, there is a navigator waveform for kx=0 and then the corresponding MRI k-space data (in the DAQ window) is sampled. The multidimensional version of the similarity metric may include calculating the similarity metric along each dimension and then combining the similarity values using an appropriate mathematical operation such as using the sum of squares mathematical operation and the like.

Another feature of the motion compensation method 50 is the ability to restrict the amount of similarity computation that is performed on the navigator projection data. For instance, in cases where the region of interest does not cover the entire field of view (FOV) of a given MR image, or if different types of anatomy are present within the FOV of a given MR image, it may be advantageous in terms of efficiency to restrict the calculation of the similarity metric to a region covering the region of interest or just a single type of anatomy. For instance, following the example given in FIG. 3c, this may be achieved by limiting the amount of projection data, in this example along the x-axis, that is used for calculating the similarity metric.

Two sets of experiments were performed in two different anatomical regions to evaluate the feasibility of the motion compensation method 50. In the first set of experiments, imaging was performed in the hearts of two healthy volunteers. During these scans (and unlike conventional techniques), no monitoring of physiological parameters was performed. In the second set of experiments, the motion compensation method 50 was applied to study joint kinematics in the wrist of three healthy volunteers.

In the experiments, a 2D FIESTA sequence with TR=4.6 ms (i.e. data acquisition period for one sampling of k-space data), flip angle of 50°, k-space data matrix=128×128, and FOV=26 cm was used. Navigator echo data (i.e. a $k_y=0$ line) was acquired after every 8 k-space lines (as shown in FIG. 3a). MRI and navigator echo data were acquired for a total of 30 seconds to allow for a repeated sampling of the k-space data matrix. To form an MR image retrospectively at any time during data acquisition, the navigator echo data acquired at that time was taken as the reference navigator projection. The projection formed from this reference was then correlated with all of the other projections to determine the set of similar projections. A complete MR image was formed by selecting k-space data associated with projections that possessed maximal correlation to the reference navigator projection. Residual displacement (if any) was then removed, and the MR image constructed. By using consecutive navigators as references and repeating the data selection procedure, dynamic movies with a temporal resolution of 8*TR (=37 ms) were generated.

Figure 4A:
FIGS. 4a and 4b are non-ECG gated, free-breathing cardiac MRI images taken in systole and diastole, respectively, obtained using the motion compensation method of the invention.
Figure 4B:
Figure 4C:
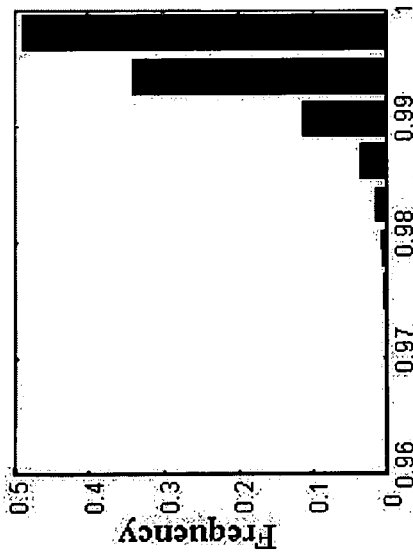
FIG. 4c is a histogram of correlation values of the projections used to generate 320 cardiac MR images; and, FIGS. 4d and 4e are MR images of the wrist acquired during side-to-side motion using the motion compensation method of the invention.

Referring now to FIGS. 4a and 4b, shown therein are non-ECG gated, free-breathing cardiac images in systole and diastole respectively. The sharp edges and lack of surrounding artifact indicate the effectiveness of the motion compensation method 50. All projections acquired in the first 12 seconds were used as references. The navigator echo data was sampled for projections along the horizontal direction (i.e. ky=0). These were used to generate a total of 320 images with a temporal resolution of 37 ms. FIG. 4c is a histogram of correlation values of the projections used to generate all 320 images. FIG. 4c indicates that correlation values of the projections in this data set ($C_i(\Delta x_i)$) are large (>0.96). It can be shown that correlation values in this range indicate that the projections are identical within noise [5]. Residual displacements ($\Delta x_i$) up to 8 mm were calculated for this data. These (rigid-body) translations were removed prior to image reconstruction by applying the appropriate linear k-space phase factors.

Figure 4D:
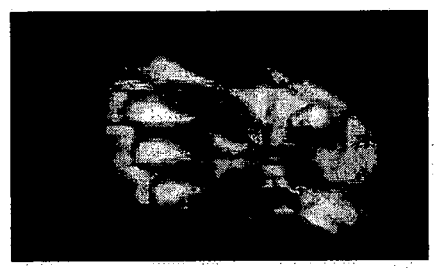
Figure 4E:
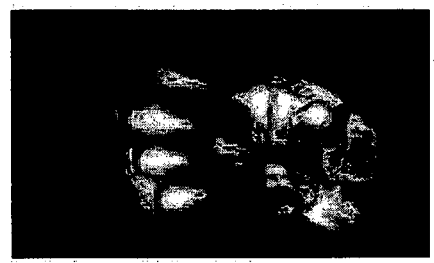

In another demonstration of the motion compensation method 50, images of the wrist were acquired during side-to-side motion using the data acquisition parameters given above. FIGS. 4d and 4e are images acquired during ulnar and radial deviation respectively. The navigator echo data was sampled for projections along the horizontal direction. Once again, the motion compensation method 50 provided images with sharp edges and minimal blurring.

The results demonstrate that the motion compensation method 50 is effective at imaging in the presence of complex, non-rigid-body motion. In the case of joints (FIGS. 4d and 4e), such images could not have been obtained with conventional methods, since there are no readily available physiological measures with which to monitor joint motion. In the case of the heart (FIGS. 4a and 4b), the motion compensation method 50 was successfully applied without the use of ECG monitoring. Thus, the performance of the motion compensation method 50 should not likely be affected in patients with arrhythmias.

The various embodiments of the invention described herein have been provided as examples only. It should be understood that various modifications can be made to the embodiments described and illustrated herein, without departing from the invention, the scope of which is defined in the appended claims.

REFERENCES

[1] R. L. Ehman, J. P. Felmlee, Adaptive Techniques for High-Definition MR Imaging of Moving Structures. Radiology 1989; 173: 255–263.
[2] Y. Wang, R. C. Grimm, J. P. Felmlee, S. J. Riederer, R. L. Ehman, Algorithms for Extracting Motion Information from Navigator Echoes. Magnetic Resonance in Medicine 1996; 36: 117–123.
[3] Y. Wang, R. L. Ehman, Retrospective Adaptive Motion Correction for Navigator-Gated 3D Coronary MR Angiography. Journal of Magnetic Resonance Imaging 2000; 11: 208–214
[4] T. A. Spraggins, Wireless Retrospective Gating: Application to Cine Cardiac Imaging. Magnetic Resonance Imaging 1990; 8: 675–681.
[5] M. S. Sussman, J. A. Stainsby, N. Robert, N. Merchant, G. A. Wright, Variable-Density Adaptive Imaging for High-Resolution Coronary Artery MRI. Magnetic Resonance in Medicine 2002; 48; 753–764.

The invention claimed is:

1. A method for acquiring MR image data for an object and performing motion compensation on the MR image data, the method comprising:
    a) generating a uniform magnetic field through the object;
    b) generating magnetic field gradients for imaging a portion of the object and an RF excitation field for evoking NMR response signals from the object;
    c) generating a plurality of navigator waveforms for evoking a corresponding plurality of navigator echoes from the portion of the object while the object is being imaged;
    d) sampling the NMR response signals and the plurality of navigator echoes; and,
    e) processing the plurality of navigator echoes by determining a subset of similar navigator echoes according to a similarity metric and removing rigid-body translations from the sampled NMR response signals associated with the subset of similar navigator echoes; and
    f) displaying MR images generated based on the motion compensated MR image data.

2. The method of claim 1, wherein (e) further includes:
    g) generating a plurality of navigator projections from the plurality of navigator echoes;
    h) selecting a reference navigator projection from the plurality of navigator projections;
    i) calculating a plurality of similarity values according to the similarity metric for the plurality of navigator projections with respect to the reference navigator projection; and;
    j) selecting the subset of similar navigator echoes from the plurality of navigator projections having the highest similarity values.

3. The method of claim 2, wherein (h) includes calculating the similarity values within a subset of the navigator projections that correspond to a region of interest in the portion of the object being imaged.

4. The method of claim 2, wherein the method comprises acquiring navigator echoes until a sufficiency criterion is satisfied.

5. The method of claim 4, wherein the method includes defining the sufficiency criterion so that the selected navigator projections differ at most by noise and rigid-body translation.

6. The method of claim 4, wherein the similarity metric is the correlation coefficient, and the method includes defining the sufficiency criterion so that the standard deviation of the calculated correlation coefficient values under a Fisher Transformation is less than the inverse of the square root of the number of pixels in a given navigator reference projection.

7. The method of claim 4, wherein in (d) sampling of the NMR response signals includes repeatedly only sampling k-space data for which corresponding navigator echoes have not yet met the sufficiency criterion.

8. The method of claim 1, wherein (e) further includes calculating a rigid-body translation for the similar navigator echoes in the selected subset and applying a linear phase correction based on the translation to the corresponding NMR response signals.

9. The method of claim 1, wherein (c) includes quasi-periodically interspersing the navigator waveforms in the magnetic field gradients and the RF excitation field.

10. The method of claim 1, wherein (c) includes generating magnetic field gradients associated with the navigator waveforms for providing a linear k-space sampling trajectory through k-space origin for sampling a given navigator echo.

11. The method of claim 1, wherein (c) includes generating the magnetic field gradients associated with the navigator waveforms for providing reference navigator projections in at least two dimensions and computing a multi-dimensional similarity metric to find navigator echoes that are similar in the at least two dimensions.

12. The method of claim 1, wherein the method comprises basing the similarity metric on one of correlation coefficients, least squares, cross-correlation, and mutual information.

13. An MRI system for acquiring MR image data for an object and performing motion compensation on the MR image data, the MRI system comprising:
 a) an MRI device for generating a uniform magnetic field through the object, magnetic field gradients for imaging a portion of the object and an RF excitation field for evoking NMR response signals from the object;
 b) a computer for controlling the operation of the MRI system;
 c) a motion compensation module for generating a plurality of navigator waveforms for evoking a corresponding plurality of navigator echoes from the portion of the object that is being imaged, and processing the plurality of navigator echoes by determining a subset of similar navigator echoes and removing rigid-body translation from the NMR response signals associated with the subset of similar navigator echoes; and,
 d) interface circuitry for generating waveforms in response to instructions received from the computer and the motion compensation module and sending the waveforms to the MRI device for producing the magnetic field gradients, the RF excitation field and the navigator waveforms, the interface circuitry further being configured for sampling the NMR response signals and the plurality of navigator echoes.

14. The system of claim 13, wherein the motion compensation module generates a plurality of navigator projections from the plurality of navigator echoes, selects a reference navigator projection from the plurality of navigator projections, calculates a plurality of similarity values according to a similarity metric for the plurality of navigator projections with respect to the reference navigator projection, and selects the subset of similar navigator echoes from the plurality of navigator projections having the highest similarity values.

15. The system of claim 14, wherein the motion compensation module further calculates a rigid-body translation for the similar navigator echoes in the selected subset and applies a linear phase correction based on the displacement to the corresponding NMR response signals.

16. The system of claim 14, wherein the motion compensation module calculates the similarity values within a subset of the navigator projections that correspond to a region of interest in the portion of the object being imaged.

17. The system of claim 14, wherein the interface circuitry is configured to acquire navigator echoes until a sufficiency criterion is satisfied.

18. The system of claim 17, wherein the sufficiency criterion is defined so that the selected navigator projections differ at most by noise and rigid-body translation.

19. The system of claim 17, wherein the sufficiency criterion is defined so that the standard deviation of the calculated correlation coefficient values under a Fisher Transformation is less than the inverse of the square root of the number of pixels in a given navigator reference projection.

20. The system of claim 13, wherein the motion compensation module and interface circuitry quasi-periodically intersperses the navigator waveforms in the magnetic field gradients and the RF excitation field.

21. The system of claim 13, wherein the motion compensation module and interface circuitry in conjunction with the MRI device generate magnetic field gradients associated with the navigator waveforms for providing a linear k-space sampling trajectory through k-space origin for sampling a given navigator echo.

22. The system of claim 13, wherein the motion compensation module and interface circuitry in conjunction with the MRI device generate magnetic field gradients associated with the navigator waveforms for providing reference navigator projections in at least two dimensions and computing a multi-dimensional similarity metric to find navigator echoes that are similar in the at least two dimensions.

23. The system of claim 13, wherein the similarity metric is based on one of correlation coefficients, least squares, cross-correlation, and mutual information.

24. A method for performing motion compensation on MR image data, the MR image data including NMR response signals and corresponding navigator echoes, the method comprising:
 a) selecting a similarity metric;
 b) applying the similarity metric to the navigator echoes to determine a subset of similar navigator echoes; and
 c) removing rigid-body translations from the NMR response signals associated with the subset of similar navigator echoes; and d) displaying MR images generated based on the motion compensated MR image data.

25. The method of claim 24, wherein (b) further comprises:
 e) generating navigator projections from the navigator echoes;
 f) selecting a reference navigator projection from the navigator projections;
 g) calculating a plurality of similarity values according to the similarity metric for the navigator projections with respect to the reference navigator projection; and
 h) selecting the subset of similar navigator echoes from the navigator projections having the highest similarity values.

26. The method of claim 25, wherein (c) further includes calculating a rigid-body translation for the similar navigator echoes in the selected subset and applying a linear phase correction based on the translation to the corresponding NMR response signals.

27. The method of claim 25, wherein (f) includes calculating the similarity values within a subset of the navigator projections that correspond to a region of interest in the MR image data.

28. A computer program product comprising a computer readable medium embodying a program code means executable by a processor for carrying out a method for performing motion compensation on MR image data, the MR image data including NMR response signals and corresponding navigator echoes, the method comprising:
 a) selecting a similarity metric;
 b) applying the similarity metric to the navigator echoes to determine a subset of similar navigator echoes;
 c) removing rigid-body translations from the NMR response signals associated with the subset of similar navigator echoes; and
 d) displaying MR images generated based on the motion compensated MR image data.

* * * * *